US007539462B2

(12) United States Patent  
Peckham et al.

(10) Patent No.: US 7,539,462 B2  
(45) Date of Patent: May 26, 2009

(54) CONFIGURABLE MULTI-MODE MODULATION SYSTEM AND TRANSMITTER

(75) Inventors: David S. Peckham, Barrington Hills, IL (US); Richard B. Meador, Austin, TX (US); Kevin B. Traylor, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 546 days.

(21) Appl. No.: 11/199,737

(22) Filed: Aug. 9, 2005

(65) Prior Publication Data

US 2007/0037530 A1 Feb. 15, 2007

(51) Int. Cl.
*H04B 1/02* (2006.01)
(52) U.S. Cl. .......................... 455/83; 455/143
(58) Field of Classification Search ................ 455/425, 455/550.1, 142, 143, 144, 126, 108, 110, 455/93; 330/85, 129
See application file for complete search history.

(56) References Cited

U.S. PATENT DOCUMENTS

| | | | |
|---|---|---|---|
| 6,047,168 | A | 4/2000 | Carlsson et al. |
| 6,353,359 | B1 | 3/2002 | Leizerovich |
| 6,366,177 | B1 | 4/2002 | McCune et al. |
| 6,480,704 | B1 * | 11/2002 | Pakonen ...................... 455/126 |
| 6,670,849 | B1 * | 12/2003 | Damgaard et al. .......... 330/129 |
| 2003/0038675 | A1 | 2/2003 | Gailus et al. |
| 2003/0109222 | A1 | 6/2003 | Sun et al. |
| 2003/0118143 | A1 | 6/2003 | Bellaouar et al. |
| 2003/0215025 | A1 | 11/2003 | Hietala |
| 2003/0215026 | A1 | 11/2003 | Hietala |
| 2003/0224740 | A1 | 12/2003 | Takano et al. |
| 2004/0219891 | A1 | 11/2004 | Hadjichristos |
| 2004/0229592 | A1 | 11/2004 | Matsui et al. |
| 2004/0264583 | A1 | 12/2004 | Ahmed |
| 2006/0003712 | A1 * | 1/2006 | Schell ...................... 455/115.1 |

OTHER PUBLICATIONS

Michael R. Elliott, et al., A Polr Modular Transmitter for GSM/EDGE, IEEE Journal of Solid-State Circuits, Dec. 2004, pp. 2109-2199, vol. 39, No. 12.
Tridad Sowlati, et al., Quad-Band GSM/GPRS/EDGE Polar Loop Transmitter, IEEE Journal of Solid-State Circuits, Dec. 2004, pp. 2190-2199, vol. 29, No. 12.

* cited by examiner

*Primary Examiner*—Edward Urban
*Assistant Examiner*—Tu X Nguyen
(74) *Attorney, Agent, or Firm*—Dillon & Yudell LLP

(57) ABSTRACT

A multi-mode transmitter architecture is configurable for multiple modulation modes using either polar or polar-lite modulation. Multiplexed signal paths and reconfigurable components are controlled for performance in GMSK and EDGE burst modes. Polar-lite EDGE modulation is programmed by setting a multiplexer coupling a first amplitude modulated signal path with a frequency modulated signal path input to a dual-mode power amplifier for amplification of the combined EDGE transmission signal. In full-polar EDGE modulation, amplitude modulated signal is multiplexed into a second amplitude modulated signal path for A/D conversion and comparison with a polar feedback signal coupled from the power amplifier output. The resulting comparison is applied to a power control port of the power amplifier to amplitude modulate the EDGE transmission output. Multiplexers are configured to disconnect the amplitude modulated paths when operating in GMSK signaling for both full-polar and polar-lite modulation. Multiplexers selectively couple power feedback into the second amplitude modulated signal path to provide power control and output power ramping for burst transmissions.

34 Claims, 5 Drawing Sheets

| OPERATING MODES 301 | TYPE OF PA 302 | PA OPERATION 304 | PA_MODE_SEL 224 | MODULATION_SEL 230 | MOD_BYPASS_EN 255 | AM_MOD_POWER_SEL 264 | ANA_DIG_SEL 283 | INTEG_BUFFER_SEL 286 |
|---|---|---|---|---|---|---|---|---|
| POLAR LITE (EDGE MODE) 306 | DUAL MODE | LINEAR MODE | LINEAR | 8_PSK | MODULATOR | POWER | DIG | BUFFER |
| POLAR LITE (GMSK MODE) 308 | DUAL MODE | SAT MODE | SAT MODE | GMSK | GAIN STAGE | POWER | DIG | BUFFER |
| FULL POLAR (EDGE MODE) 310 | SAT MODE | SAT MODE | SAT MODE | 8_PSK | GAIN STAGE | AM MOD | ANALOG | INTEGRATOR |
| FULL POLAR (GMSK MODE) 312 | SAT MODE | SAT MODE | SAT MODE | GMSK | GAIN STAGE | POWER | ANALOG | INTEGRATOR |

CONFIGURATION SETTINGS 314

FIG. 3

GMSK BURST
FULL POLAR AND POLAR LITE MODE

EDGE BURST (POLAR_LITE MODE)

CONFIGURABLE MULTI-MODE MODULATION SYSTEM AND TRANSMITTER

BACKGROUND OF THE INVENTION

1. Field of the Invention

The present invention relates generally to modulation and power control in a wireless communication device transmitter, and more particularly to a system for implementing amplitude and phase modulation with a closed or open power control feedback loop capable of supporting either a linear or a non-linear saturated mode power amplifier.

2. Description of the Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld telephone like a communication handset. These variations include, for example, global system for mobile communication (GSM) radios, code division multiple access (CDMA) radios, integrated dispatch enhanced network (IDEN) radios and terrestrial trunked (TETRA) radios. Generally, each of these different types of radios requires a different modulation and power control method to meet system specifications The different modulation and power control schemes each have advantages and disadvantages.

In a typical GSM system, a gaussian minimum shift keying (GMSK) modulation scheme supplies a very clean, phase modulated (PM) or frequency modulated (FM) transmit signal to a non-linear power amplifier (PA). A non-linear saturated PA is ideally suited for GMSK modulation because the input RF waveform exhibits information only in its phase component. In such an arrangement, the non-linear PA is highly efficient at modulation of the phase signal and minimizing power consumption. Because the modulated signal is typically supplied directly from a GMSK modulated phase lock loop (PLL), the need for filtering, either before or after the PA, is also minimized.

Other transmission standards are now being developed in which both a PM signal and an amplitude modulated (AM) signal are transmitted. Standards such as these often increase the data rate without increasing the bandwidth of the transmitted signal. Unfortunately, existing GSM modulation schemes and chip set architectures are not easily adapted to transmit a signal that includes both a PM component and an AM component. One reason for this difficulty is that in order to transmit a signal containing PM and AM components, a highly linear PA is typically required. Unless the PA is very linear, it may distort the combined transmission signal by causing undesirable AM to AM and AM to PM distortion. Linear PAs are very inefficient, however, thus consuming significantly more power than a non-linear PA and drastically reducing the life of the battery or other power source.

Modern wireless communication devices typically contain a multi-mode transmitter that can function as multiple types of radio communication devices effective to generate multiple transmission mode signals from the input baseband signal. For example, one radio communication device may function as both a GSM and an EDGE (Enhanced Data GSM Evolution) radio communication device. The EDGE system requires a dual communication function in which communication of lower rate voice signals is performed on GMSK modulation (AM), while higher rate data communication is typically performed in $\pi/8$-rotating 8-PSK (Phase Shift Keying) modulation (AM and PM). The 8-PSK modulation format (also referred to as the EDGE-mode) can be regarded as a modulation in which an amplitude shift is further added to a phase shift of a carrier signal in the GMSK modulation. While 1-bit information is sent per symbol in the GMSK modulation format, 3-bit information is sent per symbol in the 8-PSK modulation format. This provides an advantage that communication in the EDGE system can be performed at a higher transmission rate than in the GSM system, while maintaining the same transmission bandwidth as the GSM system. However, the power consumption benefits of using a non-linear, highly efficient PA when employing a GMSK system are not realized in the EDGE system using a highly linear PA. To address this deficiency, numerous architectures have been proposed to implement both GMSK and EDGE using non-linear, more efficient PAs One dual GSM/EDGE system found in radio communication devices is the "full-polar" modulation architecture, where a polar modulator applies amplitude modulation to the supply or bias control port of a non-linear PA while simultaneously applying a phase modulated signal to the PA's RF input port. In the GMSK mode, the modulator only supplies a phase modulated signal to the RF input to the PA. In a full-polar modulation architecture, the amplitude modulation is applied to the PA by controlling the bias current, the collector voltage, or a combination of both via an analog voltage-control input to the PA. Because the PA is non-linear, a power control loop is often employed with the AM modulation applied to one or more ports of the power control loop. Therefore, the power control loop provides both a power control signal and an AM signal to the PA.

A second dual GSM/EDGE system is the "polar-lite" modulation architecture, where the polar modulator applies amplitude and phase modulation to an RF stage prior to a PA in EDGE mode. The PA stage that follows the RF stage must operate in the linear mode because the input signal contains both AM and PM components. In GMSK mode, the PA bias is reconfigured to operate in the more efficient saturated non-linear mode.

Modulation formats and architectures are continuously updated to reflect new approaches to maximize information transfers in limited bandwidths. Changes in standards or standards based on newly available spectrum may also cause designers to approach modulating transmitters with different techniques. Moreover, a preference for full-polar or polar-lite has not materialized in the market. As a result, wireless mobile handset manufacturers may manufacture an array of handset types implementing varied modulation schemes and standards. Further, manufacturers desire to quickly modify transmitter architectures as market and standards-based changes influence what is a preferred implementation, but this can be difficult when different architectures are designed with different components. For example, full-polar modulation architectures use a saturated PA for both GMSK and EDGE transmissions, while polar-lite modulation architectures require a dual-mode PA, which operates in a non-linear mode for GMSK transmissions and a linear mode for EDGE transmissions. Linear mode and dual-mode PAs continue to be widely manufactured for GSM and EDGE handsets. There are cost, size, performance, and manufacturability tradeoffs associated with linear and dual mode PAs.

As can be seen from all of the above problems, it would be desirable to implement a common transmitter architecture configurable to support multiple modulation schemes and physical components. For example, given the current market acceptance, it would be desirable to provide a transmitter platform configurable to support both polar-lite and full-polar transmitter modulation.

BRIEF DESCRIPTION OF THE DRAWINGS

In the following detailed description of exemplary embodiments of the invention, reference is made to the accompanying drawings, which form a part hereof, and in which is shown by way of illustration specific exemplary embodiments in which the invention may be practiced, and in which like numbers represent the same or similar elements, as follows:

FIG. 3 shows a table of configuration settings for the transmitter in each operating mode, in accordance with a preferred embodiment of the present invention.

DETAILED DESCRIPTION OF PREFERRED EMBODIMENTS

Figure 1:
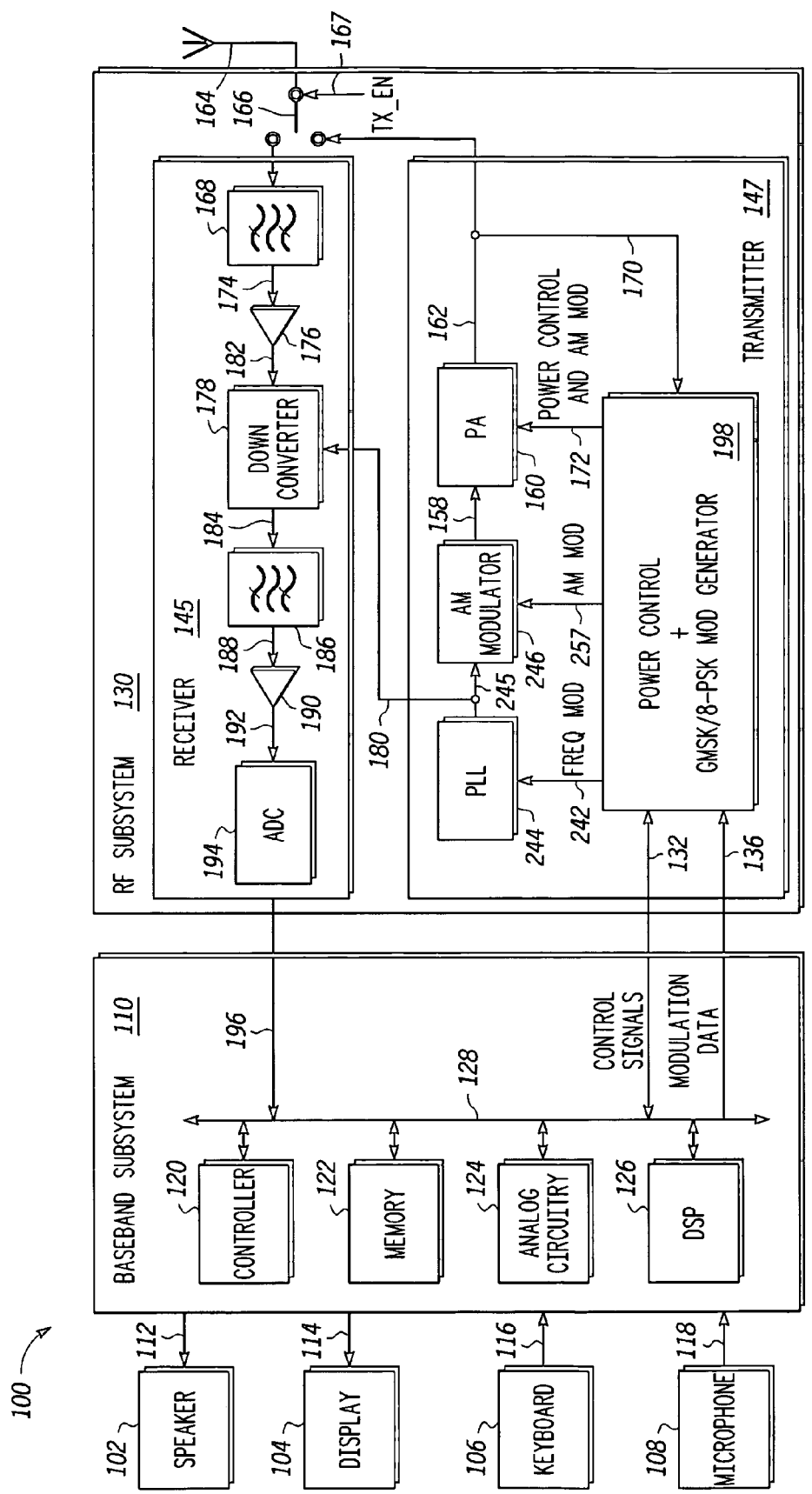
FIG. 1 shows a block diagram illustrating a portable radio communications device.

With reference now to the figures, and in particular with reference to FIG. 1, there is shown a simplified block diagram illustrating a portable radio communications device 100, in accordance with a preferred embodiment of the invention. Communications device 100 includes speaker 102, display 104, keyboard 106, and microphone 108, all connected to baseband subsystem 110. In a particular embodiment, communications device 100 can be, for example but not limited to, a portable telecommunication handset such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively, as known to those skilled in the art. Baseband subsystem 110 includes controller 120, memory 122, analog circuitry 124, and digital signal processor (DSP) 126 in communication via bus 128. Bus 128, though shown as a single bus, may be implemented using a number of busses connected as necessary among the subsystems within baseband subsystem 110. Controller 120 and memory 122 provide the signal timing, processing and storage functions for communications device 100. Analog circuitry 124 provides the analog processing functions for the signals within baseband subsystem 110. Baseband subsystem 110 provides control signals to radio frequency (RF) subsystem 130 via connection 132. Although shown as a single connection 132, the control signals may originate from DSP 126 or from controller 120, and are supplied to a variety of points within RF subsystem 130. It should be noted that, for simplicity, only the basic components of communications device 100 are illustrated. Base band modulation data is generated by DSP 126 and transferred to bus 128 for communication from base band subsystem 110 to RF subsystem 130 via connection 136.

RF subsystem 130 includes receiver 145, transmitter 147, switch 166 and antenna 164. The base band modulation data 136 is converted by power control and modulation generator 198 to a frequency modulated representation on the output connection 242 applied to the modulation port of phase lock loop (PLL) 244. PLL 244 modulates the base band frequency component into a frequency modulated RF carrier onto connection 245. AM modulator 246 receives a phase or frequency modulated RF signal, from PLL 245 via connection 245, and base band analog information from power control and modulation generator 198 via connection 257. AM modulator 246 serves to modulate the base band analog information and provides a modulated RF signal via connection 158 to power amplifier (PA) 160. For the case where an AM modulation component is not used such as FM transmissions, AM modulator 246 is configured to operate as a RF gain stage. Power control and modulation generator 198 may also be configured to provide AM modulation and power control to PA 160 via connection 172. PA 160 amplifies the AM and PM or PM only modulated signal on connection 158 to the appropriate power level for transmission via connection 162 to antenna 164. Antenna Switch 166 controls whether the amplified signal on connection 162 is transferred to antenna 164 or whether a received signal from antenna 164 is supplied to receiver 145. Antenna switch 166 is coupled to antenna 164 for connecting receiver 145 or transmitter 147 for wireless communications. Controller 120 sets antenna switch 166 with the transmit enable signal (TX_en) 167 when coupling antenna 164 with transmitter 147. Controller 120 also has the necessary intelligence to appropriately control RF Subsystem 130 via control signals 132 in accordance with the desired operating mode.

In transmission systems such as GSM (which employs only PM) or GSM-EDGE (which employs both AM and PM), the power output of the portable transceiver must be closely controlled per system specifications. A portion of the amplified transmit signal power on connection 162 is supplied via connection 170 to power control and modulation generator element 198. Power control element and modulation generator 198, may form a closed or open power control feedback loop and supply a control signal on connection 172 instructing the PA 160 as to the correct power level to which the signal on connection 158 should be amplified for transmission in burst mode including power up and power down levels. The operation of transmitter 147 will be described in further detail herein below with respect to FIGS. 2-6.

A signal received by antenna 164 may, at the appropriate time determined by baseband subsystem 110, be directed via switch 166 to couple to filter 168. Filter 168 will filter the received signal and supply the filtered signal on connection 174 to low noise amplifier (LNA) 176. Receive filter 168 may be a bandpass filter that passes all channels of the particular cellular system where the communications device 100 is operating. As an example, for a 900 MHz GSM system, receive filter 168 would pass all frequencies from 935.1 MHz to 959.9 MHZ, covering all 124 contiguous channels of 200 kHz each. The purpose of this filter is to reject all frequencies outside the desired region. LNA 176 amplifies the very weak signal on connection 174 to a level at which downconverter 178 can translate the received RF signal to a base band or a very low intermediate frequency such as 100 KHz. Alternatively, the functionality of LNA 176 and downconverter 178 can be accomplished using other elements, such as for example but not limited to, a low noise block downconverter (LNB).

Downconverter 178 receives a frequency reference signal, also called a "local oscillator" signal, or "LO," from synthesizer 148, via connection 180. That signal instructs the downconverter 178 as to the proper frequency to which to downconvert the signal received from LNA 176 via connection

182. The downconverted frequency is either a base band signal or an intermediate frequency (IF). Downconverter 178 sends the base band or IF signal via connection 184 to channel filter 186 Channel filter 186 filters the downconverted signal and supplies it via connection 188 to amplifier 190. The channel filter 186 selects the one desired channel and rejects all others. Using the GSM system as an example, only one of the 124 contiguous channels is actually to be received. After all channels are passed by filter 168 and downconverted in frequency by downconverter 178, only the one desired channel will appear precisely at the input of channel filter 186. PLL 244 determines the selected channel by controlling the local oscillator frequency supplied on connection 180 to downconverter 178. Amplifier 190 amplifies the received signal and supplies the amplified signal via connection 192 to analog-to-digital converter (ADC) 194. ADC 194 converts these analog signals to a digital signal and transfers it via connection 196 and bus 128 to DSP 126 for demodulation and further processing.

Figure 2:
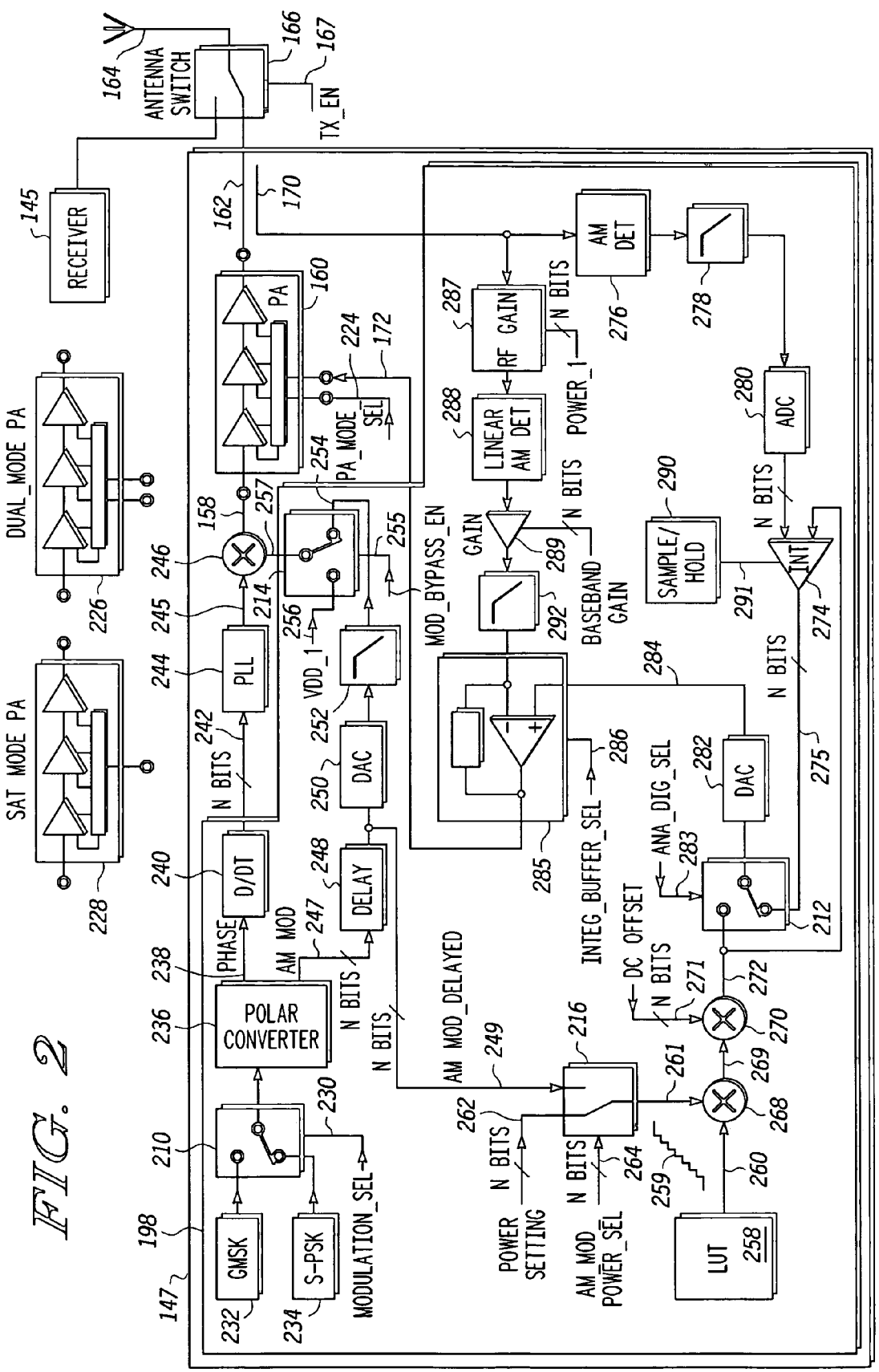
FIG. 2 is a more detailed block diagram illustrating the RF subsystem of FIG. 1.

FIG. 2 is a more detailed block diagram illustrating RF subsystem 130 of FIG. 1. In accordance with a preferred embodiment of the invention, transceiver 147 supports the use of two types of PAs, either non-linear or dual-mode. For a dual-mode PA operating in linear mode, the present invention is configurable to combine AM modulation to a phase modulated signal using a modulator stage located at the input to the PA. For the same dual mode PA operating in non-linear or saturated mode, the present invention is configurable to provide only a phase modulated signal to the input of the PA. For the second type of PA that operates only in non-linear mode or saturated mode, the present invention is configured to apply AM modulation to the PA's power control loop and/or to apply a phase modulated signal to the input of the PA In this way, the preferred embodiment allows for the transmitter to be architected for full-polar or polar-lite modulation compatible with different PA designs. The PA can be incorporated into the transmitter as an integrated circuit, a hybrid module, or as a separate component coupled to one or more integrated circuits comprising the transmitter.

In a first configuration useful for full-polar modulation, PA 160 is implemented using non-linear (saturated) PA 228 and transceiver 147 is programmatically configured to provide both AM and PM modulation for EDGE transmission. In a second configuration using the non-linear PA 228, transceiver 147 is configured to provide only PM modulation for GMSK transmission. In a third configuration useful for polar-lite modulation, PA 160 is implemented using a dual-mode PA 226 and transceiver 147 is programmatically configured to provide both AM and PM modulation for EDGE modulation. In a fourth configuration using dual-mode PA 226, transceiver 147 is configured to provide only PM modulation.

Although described with particular reference to a GSM portable transceiver, the configurable power control feedback loop of the preferred embodiment of the present invention may be implemented in any transmitter system where the circuit for adding an AM signal to a PM signal at the PA is configurable as a function of the type of PA selected for the circuit. Moreover, the configuration of the transceiver for the desired modulation can be implemented in software, hardware, or a combination of software and hardware. In the preferred embodiment disclosed, selected functionality of the transmission path and power control feedback loop is implemented in hardware and software. However, it should be understood the invention is not intended to be so limited. The hardware portion can be implemented using specialized hardware logic, which may include any or a combination of the following technologies that are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc. The software portion of the preferred embodiment can be stored in a memory and be executed by a suitable instruction execution unit (microprocessor). The software for implementing the software portion comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

With reference now back to FIG. 2, in accordance with the preferred embodiment, transmitter 147 can be configured to support different modulation schemes depending on whether a dual-mode or non-linear PA is installed in the transceiver. RF Subsystem 130 includes a receiver 145 and a transmitter 147 coupled to an antenna 164 via a switch 166 as explained above.

The architecture of the preferred embodiment supports the use of either a saturated mode PA or a dual-mode PA depending on the application for RF Subsystem 130. During the design or manufacture of communications device 100, RF subsystem 130, transceiver 147 or other modules and components as the case may be, a dual-mode PA 226 or a saturated mode PA 228 is selected to operate as PA 160. The designer of the transceiver or the manufacturer of the wireless communication device selects the PA type best suited for a particular application based on numerous considerations such as cost, size, reliability, efficiency, stability, and VSWR (Voltage Standing Wave Ratio) performance. This is represented in FIG. 2 by showing a dual-mode PA 226 and a saturated mode PA 228, either of which can be designed into PA 160. As will be appreciated by those skilled in the art, PA 160 is designed as a dual-mode PA 226 for transmitter operation in a polar-lite operating mode or is designed as a saturated mode PA 228 for transmitter operation in full-polar operation. For example, in power sensitive applications such as wireless handsets, the design choice would likely be a saturated PA 228. Alternatively, the application may dictate VSWR performance over power efficiency and the designer would select a dual-mode PA 226 for PA 160.

FIG. 3 shows a table of the configuration settings for placing transmitter 147 in a desired operating mode. For example, when operating in polar-lite modulation (306, 308), dual-mode PA 226 is designed into PA 160 (indicated at column 302), and controller 120 sets the PA mode select signal 224 to either linear or saturated (SAT) mode to place the PA in linear or saturated operation (indicated at column 304) for EDGE modulation 306 or GMSK modulation 308, respectively. Similarly, when operating in full-polar modulation (310, 312), saturated mode PA 228 is designed into PA 160 (indicated at column 302), and controller 120 sets the PA mode select signal 224 to saturated (SAT) mode for EDGE modulation 310 or GMSK modulation 312. However, for PA 228 in FIG. 2, the PA_MODE_SEL port is not shown because PA 228 operates in the same saturated mode for GSM and EDGE transmissions. Consequently, setting PA mode select signal 224 in modulations 310, 312 is not necessary.

With reference back to FIG. 2, mapping module 232 encodes the baseband signals received from baseband subsystem 110 into GMSK encoding, and mapping module 234 encodes the baseband signals into a 8-PSK encoded data stream. Depending on the operating mode, controller 120 selects the modulation scheme using modulation select signal 230, which sets multiplexer 210 to select either GMSK mapping module 232 or 8-PSK (EDGE) mapping module 234.

The encoded baseband signals from multiplexer 210 are passed to polar converter 236, which converts the encoded signals into phase and amplitude components. The phase component 238 is passed through digital differentiator (d/dt) 240 and converted from a phase to a frequency representation on the output connection 242, thereafter applied to the modulation port of PLL 244. PLL 244 modulates the base band frequency component into a frequency modulated RF carrier output onto connection 245. In a broader sense of describing modulated signals, the frequency modulated component on connection 245 may also be described as a phase modulated component.

The amplitude modulated (AM) component 247 output from polar converter 236 is passed through signal delay block 248 to compensate for signal delays and provide synchronization between the phase and amplitude signal paths. The delayed AM component signal is output on connection 249 for conversion by digital-to-analog converter (DAC) 250, and is thereafter transferred through low-pass filter 252 before being applied to an input of multiplexer 214.

Multiplier 246 AM modulates the frequency (or "phase") modulated signal on connection 245 with the output signal from multiplexer 214 on connection 257. As seen in FIG. 3, modulation bypass enable signal (MOD_BYPASS_EN) 255 controlling multiplexer 214 is set by controller 120 depending upon whether operating in polar-lite EDGE mode 306, polar-lite GMSK mode 308, full-polar EDGE 310 or full-polar GMSK 312 mode. If operating in EDGE mode 306, signal 255 is set to pass the AM signal on connection 254 to input 257 of multiplier 246, where multiplier 246 modulates the phase modulated signal on connection 245 by the AM modulated signal on connection 257. In GMSK modulation 308, for example, AM modulation is not utilized, so modulation bypass enable signal 255 switches multiplexer 214 to pass input supply voltage (VDD_1) 256 to connection 257 with multiplier 246, which converts multiplier 246 to an RF gain stage.

In the EDGE mode 306, multiplier 246 outputs a phase and amplitude modulated signal to dual-mode PA 226 operating in the linear mode of operation, thereafter outputting the amplified RF signal on connection 162. Alternatively, if operating the dual-mode PA 226 in the GMSK mode 308, the phase modulated signal 245 passes through the multiplier stage 246 to the dual-mode PA 226 operating in the saturated mode, thereafter outputting the amplified RF signal on connection 162.

In a similar manner to the forward transmission path, controller 120 sets the configuration settings 314 in power control element and modulation generator 198 as a function of the operating mode 301 of the transceiver 147. Power control element and modulation generator 198 operates to ramp the output RF power up and down during burst transmissions, as well as to control output power during signal transmission. As a base station commands the mobile handset to output at a selected output wattage, power control and modulation generator 198 controls the output wattage at antenna 164 through operation of control loop feedback. Directional coupler 170 taps the output signal 162 from PA 160 and couples into power control element and modulation generator 198, which generates an automatic power control signal on connection 172 to a power control port of PA 160.

Look-up table (LUT) 258 is clock driven to provide a ramp-up and ramp-down output signal 259 on connection 260 when operating in a burst modulation scheme. Ramp signal 259 is multiplied with a signal output 261 from multiplexer 216 by multiplier 268. Amplitude modulation power selection signal (AM_MODE_POWER_SEL) 264 by switches multiplexer 216 to couple signal output 261 with power setting 262, which is set as directed by the base station, or the delayed amplitude modulation component 249, which is used for amplitude modulation of PA 160 in the full-polar EDGE mode of operation.

In the polar-lite GMSK mode 308, amplitude modulation power select signal 264 is set to output the power setting 262 from multiplexer 216. Power setting 262 is set by controller 120 in response to an instruction from the base station for a required output power level from antenna 164. The output signal 269 from multiplier 268 is multiplied by a DC offset 271 by multiplier 270. DC offset 271 provides a "fine" DC offset adjustment on the output to compensate for variations in components, and is typically set in pre-production following calibration of the mobile communications device as part of the factory calibration. The ramp signal on connection 272 is coupled to inputs of multiplexer 212 and digital integrator 274. The output of integrator 274 on connection 275 is coupled to a second input of multiplexer 212. The output of multiplexer 212 is converted to an analog signal on connection 284 by DAC 282.

In polar-lite operating modes 306 and 308, analog-digital select signal (ANA_DIG_SEL) 283 is set to switch the output of multiplexer 212 to couple with connection 275 from integrator 274. For full-polar modes 310 and 312, analog-digital select signal (ANA_DIG_SEL) 283 is set to switch the output of multiplexer 212 to couple with connection 272.

In polar-lite operating modes 306 and 308 as seen in FIG. 3, the PA output signal 162 is feed back via coupler 170 to AM detector 276, which detects the output power of the transmitted PA output signal 162, and is then filtered by low-pass filter 278 and converted to a digital signal by analog-to-digital converter (ADC) 280. The digital output from ADC 280 is compared with the multiplied ramp signal on connection 272 by digital integrator 274, which outputs the resulting comparison signal on connection 275 to an input of multiplexer 212. In modes 306, 308, the output of multiplexer 212 is coupled to the comparison signal on connection 275, which is digitally converted by DAC 282.

Reconfigurable stage 285 is set by integrator buffer select signal (INTEG_BUFFER_SEL) 286 to be automatically configured as either an integrator stage (INTEGRATOR) or a gain stage (BUFFER), as a function of the operating mode 301. In the polar-lite EDGE and GMSK modes 306, 308 integrator buffer select signal 286 is set to configure stage 285 as a buffer stage that couples the analog signal on connection 284 to the power control port of PA 160 over connection 272 to complete the closed loop feedback path. In polar lite EDGE mode 308, sample and hold register 290 is used to hold the output value of digital integrator 274 to its value immediately following power ramp up. Holding the value of integrator 274 to a constant value opens the PA power control loop so that AM and PM components of the RF signal input to PA 160 are not attenuated or filtered by the error correcting capability of the digital control loop. Note that during the polar-lite modes of operation 306, 308, components 287-292 are disabled.

Figure 4:
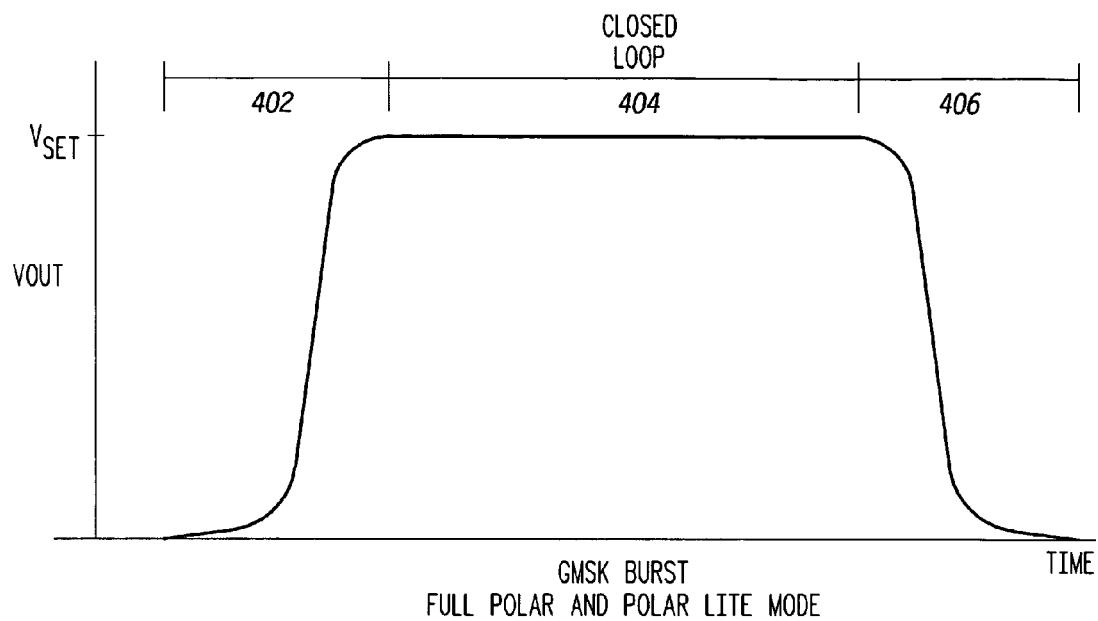
FIG. 4 shows a graph of the transmitter voltage output during a GMSK burst in the fill-polar and polar-lite modes of operation.

When operating in either of the GMSK modes of operation 308, 312, amplitude modulation is not utilized, so power control and modulation generator 198 only provides the ramp and power output level for each GMSK burst, for example as shown in the signal diagram of FIG. 4. LUT 258 is used to ramp the burst signal (402) at the output of PA 160 to the selected power setting 262 so that output signal 162 reaches the assigned power level (Vset) and remains in a closed loop operation during the GMSK burst modulation period (404) when only phase modulation is applied to the transmitted signal. LUT 258 and power control element and modulation generator 198 then reverse the process to ramp down the burst signal (406).

Figure 5:
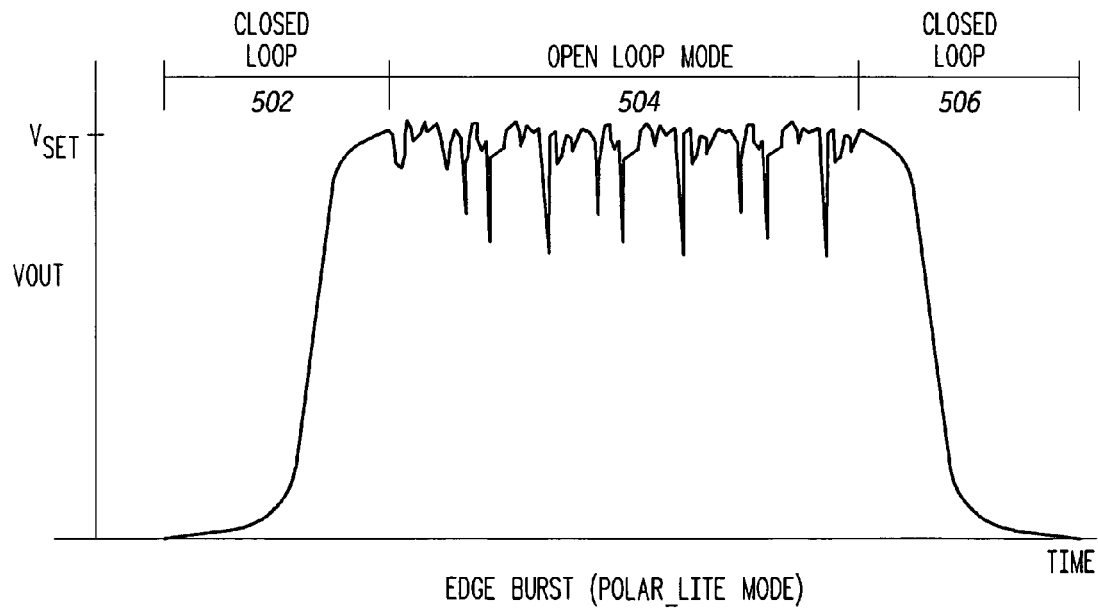
FIG. 5 shows a graph of the transmitter voltage output during a EDGE burst in the polar-lite mode of operation.

When operating in the polar-lite EDGE mode 306, power control element and modulation generator 198 operates in a closed loop configuration during power ramp-up and ramp-down, and in an open loop configuration during transmission, as seen in the signal diagram of FIG. 5. Power control element and modulation generator 198 is set to closed loop operation during ramp-up period 502 by de-asserting the hold signal 291 on integrator 274 and allowing the signals from ADC 280 and connection 272 at the inputs of integrator 274 to drive the feedback loop and bring the transmission signal output 162 of PA 160 from zero to the assigned power level. Power control element and modulation generator 198 is then held in the open loop mode during burst transmission by asserting the hold signal 291 and holding integrator 274 to a constant level. Hold signal 291 is set by sample and hold register 290, which samples the signal on connection 275 at the end of ramp up (period 502) and holds the output of integrator 274 at the sampled level during transmission (period 504), effectively ignoring the inputs to integrator 274. Power control element and modulation generator 198 is then returned to closed loop operation during ramp-down period 506 by de-asserting the hold signal 291 on integrator 274 and allowing ADC 280 and the signal on connection 272 at the inputs of integrator 274 to bring the transmission output signal 162 from the assigned power level down to zero.

Figure 6:
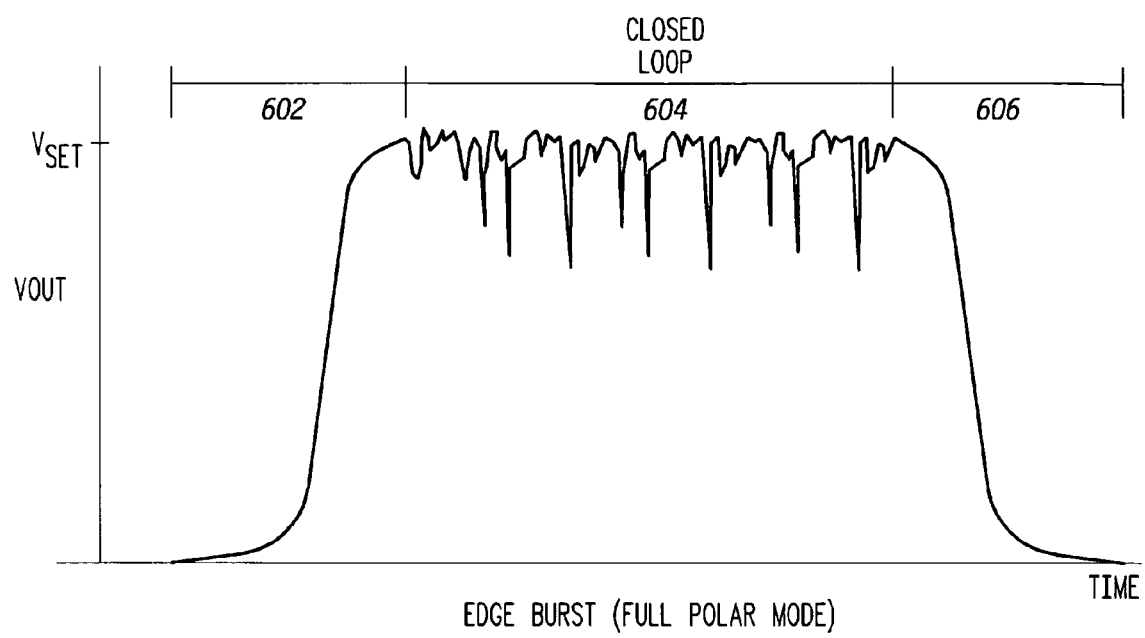
FIG. 6 shows a graph of the transmitter voltage output during a EDGE burst in the full-polar mode of operation.

When operating in the full-polar EDGE mode 310, power control element and modulation generator 198 operates in a closed loop configuration throughout the burst transmission, as seen in the signal diagram of FIG. 6. , Power control element and modulation generator 198 provides both the power level and the AM modulation of the output signal 162 in this configuration, as seen in FIGS. 2 and 3. Prior to power ramp up, AM modulation power select signal 264 switches multiplexer 216 to couple the delayed amplitude signal from delay 248 on connection 249 to connection 261. During ramp-up and ramp-down of transmission signal 162, the delayed amplitude signal coupled to connection 261 is multiplied by the ramp signal 259 on connection 260. During ramp up and ramp down, AM modulation component from delay component 248 is held constant. During EDGE burst transmission period 604, ramp signal 259 is held constant and the delayed amplitude modulation signal 249 becomes active with the AM modulation component from delay component 248. Based on the analog-digital select signal 283 being set to "ANALOG" for full-polar modes 310 and 312, the AM signal is passed from connection 272 to DAC 282 for digital-to-analog conversion. The output of DAC 282 on connection 284 is applied to the reconfigurable stage 285, which, in full-polar modes 310 and 312, is configured as an integrator by setting integrator buffer select signal 286 to "INTEGRATOR". Reconfigurable stage 285 also receives, at a second input, a signal from coupler 170 through various analog amplifier and filter components, including RF gain stage 287, linear AM detector 288, gain stage 290 and low-pass filter 292. Reconfigurable stage 285 operates to integrate the control signal from DAC 282 with the feedback signal from filter 292 to amplitude modulate the power control port of PA 160 on connection 172 during the full-polar EDGE mode of operation 310. Components 292, 289, 288, and 287 must operate as a linear stage so that power control and AM modulation signal components on connection 284 are linearly scaled to the PA output signal 162. The control loop comprised of components 285, 160, 170, 287, 288, 289 and 292 operates in continuous time mode providing a wide control bandwidth. Therefore, power and AM components signals from DAC 282 that are input to the control loop on connection 284 are not adversely attenuated by the error correcting capability of the control loop. As will be appreciated, RF gain 287 and base band gain stage 289 are set by controller 120 as a function of the assigned power levels from the base station. Amplitude detector 276, filter 278, ADC 280, digital integrator 274 and sample and hold register 290 are disabled in full-polar modes 310 and 312.

While the invention has been particularly shown and described with reference to preferred embodiments, it will be understood by those skilled in the art that various changes in form and detail may be made therein without departing from the spirit and scope of the invention. Any variations, modifications, additions, and improvements to the embodiments described are possible and may fall within the scope of the invention as detailed within the following claims.

What is claimed is:

1. A configurable multi-mode modulation system for use in a transmitter, comprising:
    a phase modulation path receiving a phase component converted from base band data and frequency modulating the phase component to generate a frequency modulated RF signal on an output;
    a first selectable amplitude modulation path receiving an amplitude component converted from base band data and, when the first selectable amplitude modulation path is selected, modulating the amplitude component to generate a first amplitude modulated signal on an output;
    a combiner circuit having a first input, a second input and an output coupled to a power amplifier, wherein the first input is coupled to the output of the phase modulation path and the second input is coupled to the output of the first selectable amplitude modulation path, the combiner circuit selectively outputting a first combined signal derived from the frequency modulated RF signal or a second combined signal derived from the first amplitude modulated signal and the frequency modulated RF signal;
    a second selectable amplitude modulation path coupled to the converter for receiving the amplitude component and, when the second selectable amplitude modulation path is selected, converting the amplitude component to a second amplitude modulated signal on an output, wherein the first and second selectable amplitude modulation paths are not selected when the modulation system is operating in GMSK modulation; and
    a configurable stage having a first input coupled to the output of the second selectable amplitude modulation path, a second input suitable for receiving a feedback signal from an output of the power amplifier, and an output suitable for coupling to a power control input of the power amplifier, wherein, when the second selectable amplitude modulation path is selected, the configurable stage is configured as an integrator for comparing the second amplitude modulated signal and the feedback signal to generate a power control signal on its output, thereby providing amplitude modulation to the power amplifier.

2. The modulation system of claim 1, wherein the first selectable amplitude modulation path is selected when the modulation system is operating in EDGE polar-lite modulation.

3. The modulation system of claim 2, wherein the power amplifier is a dual-mode power amplifier driven in a linear region when the modulator system is operating in EDGE polar-lite modulation.

4. The modulation system of claim 1, wherein the second selectable amplitude modulation path is selected when the modulation system is operating in EDGE full-polar modulation.

5. The modulation system of claim 4, wherein the power amplifier is a non-linear power amplifier driven in a saturated region when the modulator system is operating in EDGE full-polar modulation.

6. The modulation system of claim 1, wherein the first selectable amplitude modulation path further comprises a digital-to-analog converter for converting the received amplitude component to the first amplitude modulated signal.

7. The modulation system of claim 1, wherein the second selectable amplitude modulation path further comprises:
 a digital-to-analog converter;
 a multiplexer for selectively, when the first selectable amplitude modulation path is selected, coupling the digital-to-analog converter to receive the amplitude component and converting the amplitude component to the second amplitude modulated signal at the first input of the configurable stage.

8. The modulation system of claim 1, further comprising an integrator selectively coupled to the second selectable amplitude modulation path and receiving a power setting signal at a first input indicating a desired output power level for the power amplifier and the feedback signal on a second input.

9. The modulation system of claim 8, further comprising means for selectively fixing the output signal of the integrator to a constant level during a data transmission phase of EDGE polar-lite modulation.

10. The modulation system of claim 1, further comprising means for generating a ramp signal, wherein the ramp signal is coupled to the second selectable amplitude modulation path to adjust the output power of the power amplifier during a ramp phase of full-polar modulation.

11. The modulation system of claim 1, wherein the combiner receives a third input and the third input is a reference voltage, and further wherein the combiner selectively outputs a third combined signal derived from the reference voltage and the frequency modulated RF signal when operating in GMSK and EDGE full-polar modulation.

12. The modulation system of claim 1, wherein said combiner comprises a multiplier.

13. The modulation system of claim 1, further comprising a polar converter receiving base band data and converting it into the phase and amplitude components.

14. A transceiver comprising:
 a receiver; and
 a transmitter comprising:
  a power amplifier, and
  a modulator system according to claim 1.

15. A method of providing a transmitter for a selected modulation type, comprising:
 selecting one of a first or second modulation type of operation for the transmitter;
 providing a frequency modulated path generating a frequency modulated signal;
 providing an amplitude modulated path generating an amplitude modulated signal;
 if the selected modulation is the first modulation type:
  configuring the amplitude modulated path to be combined with the frequency modulated path such that the frequency modulation signal is selectively combined with
  the amplitude modulation signal to create a combined signal; and
  providing a power amplifier for amplifying the combined signal;
 if the selected modulation is the second modulation type:
  configuring the amplitude modulated path to couple with a power control input of a power amplifier, whereby the amplitude modulated signal modulates the output power of the power amplifier;
  providing a power amplifier for amplifying the phase modulated signal, wherein the output power of the power amplifier is adjusted based upon the amplitude modulated signal; and
 if the selected modulation is a third modulation type:
  configuring the amplitude modulation path to de-couple from the power amplifier; and
  providing a power amplifier for amplifying the phase modulated signal.

16. The method of claim 15, wherein the first modulation type is EDGE polar-lite modulation.

17. The method of claim 15, wherein the second modulation type is EDGE full-polar modulation.

18. The method of claim 15, wherein the third modulation type is GMSK modulation.

19. The method of claim 15, further comprising, when selected modulation is the second modulation type, configuring a feedback path to couple with the amplitude modulation path and generating an error signal from a comparison of the amplitude modulated signal and a feedback signal from the power amplifier output, wherein the error signal is coupled to the power control input of the power amplifier to control the output power of the power amplifier.

20. The method of claim 15, further comprising:
 generating a ramp signal;
 comparing the ramp signal with a feedback signal from the output of the power amplifier; and
 adjusting the output power of the power amplifier based upon the comparison.

21. A configurable multi-mode modulation system for use in a transmitter, comprising:
 a phase modulation path receiving a phase component converted from base band data and frequency modulating the phase component to generate a frequency modulated RF signal on an output;
 a first selectable amplitude modulation path receiving an amplitude component converted from base band data and, when the first selectable amplitude modulation path is selected, modulating the amplitude component to generate a first amplitude modulated signal on an output;
 a combiner circuit having a first input, a second input and an output coupled to a power amplifier, wherein the first input is coupled to the output of the phase modulation path and the second input is coupled to the output of the first selectable amplitude modulation path, the combiner circuit selectively outputting a first combined signal derived from the frequency modulated RF signal or a second combined signal derived from the first amplitude modulated signal and the frequency modulated RF signal, wherein the combiner receives a third input and the third input is a reference voltage, and further wherein the combiner selectively outputs a third combined signal derived from the reference voltage and the frequency modulated RF signal when operating in GMSK and EDGE full-polar modulation;

a second selectable amplitude modulation path coupled to the converter for receiving the amplitude component and, when the second selectable amplitude modulation path is selected, converting the amplitude component to a second amplitude modulated signal on an output; and a configurable stage having a first input coupled to the output of the second selectable amplitude modulation path, a second input suitable for receiving a feedback signal from an output of the power amplifier, and an output suitable for coupling to a power control input of the power amplifier, wherein, when the second selectable amplitude modulation path is selected, the configurable stage is configured as an integrator for comparing the second amplitude modulated signal and the feedback signal to generate a power control signal on its output, thereby providing amplitude modulation to the power amplifier.

22. The modulation system of claim 21, wherein the first selectable amplitude modulation path is selected when the modulation system is operating in EDGE polar-lite modulation.

23. The modulation system of claim 22, wherein the power amplifier is a dual-mode power amplifier driven in a linear region when the modulator system is operating in EDGE polar-lite modulation.

24. The modulation system of claim 21, wherein the second selectable amplitude modulation path is selected when the modulation system is operating in EDGE full-polar modulation.

25. The modulation system of claim 24, wherein the power amplifier is a non-linear power amplifier driven in a saturated region when the modulator system is operating in EDGE full-polar modulation.

26. The modulation system of claim 21, wherein the first and second selectable amplitude modulation paths are not selected when the modulation system is operating in GMSK modulation.

27. The modulation system of claim 21, wherein the first selectable amplitude modulation path further comprises a digital-to-analog converter for converting the received amplitude component to the first amplitude modulated signal.

28. The modulation system of claim 21, wherein the second selectable amplitude modulation path further comprises:
a digital-to-analog converter;
a multiplexer for selectively, when the first selectable amplitude modulation path is selected, coupling the digital-to-analog converter to receive the amplitude component and converting the amplitude component to the second amplitude modulated signal at the first input of the configurable stage.

29. The modulation system of claim 21, further comprising an integrator selectively coupled to the second selectable amplitude modulation path and receiving a power setting signal at a first input indicating a desired output power level for the power amplifier and the feedback signal on a second input.

30. The modulation system of claim 29, further comprising means for selectively fixing the output signal of the integrator to a constant level during a data transmission phase of EDGE polar-lite modulation.

31. The modulation system of claim 21, further comprising means for generating a ramp signal, wherein the ramp signal is coupled to the second selectable amplitude modulation path to adjust the output power of the power amplifier during a ramp phase of full-polar modulation.

32. The modulation system of claim 21, wherein said combiner comprises a multiplier.

33. The modulation system of claim 21, further comprising a polar converter receiving base band data and converting it into the phase and amplitude components.

34. A transceiver comprising:
a receiver; and
a transmitter comprising:
a power amplifier, and
a modulator system according to claim 1.

* * * * *